United States Patent [19]

Matsuzaki

[11] Patent Number: 4,646,264

[45] Date of Patent: Feb. 24, 1987

[54] PROGRAMMABLE READ-ONLY MEMORY DEVICE

[75] Inventor: Yasurou Matsuzaki, Tama, Japan

[73] Assignee: Fujitsu Limited, Kawasaki, Japan

[21] Appl. No.: 505,957

[22] Filed: Jun. 20, 1983

[30] Foreign Application Priority Data

Jun. 28, 1982 [JP] Japan ................................ 57-109917

[51] Int. Cl.[4] .............................................. G11C 11/40
[52] U.S. Cl. ...................................... 365/104; 365/96; 365/189
[58] Field of Search .................. 365/103, 104, 105, 94, 365/96, 189, 190, 194, 195, 210, 203; 307/463, 449

[56] References Cited

U.S. PATENT DOCUMENTS

| 4,287,569 | 9/1981 | Fukushima | 365/96 |
| 4,369,503 | 1/1983 | Isogai | 365/189 |
| 4,488,261 | 12/1984 | Ueno et al. | 365/105 |
| 4,511,811 | 4/1985 | Gupta | 307/463 |
| 4,554,469 | 11/1985 | Segawa et al. | 307/449 |

Primary Examiner—Terrell W. Fears
Attorney, Agent, or Firm—Staas & Halsey

[57] ABSTRACT

A programmable ROM device comprising, for example, junction-shorting-type or fuse-blown-type memory cells, connected between word lines and bit lines, in which device information is written into a selected memory cell by applying a high voltage to a terminal such as a CE terminal and by applying a write-in current to the bit line connected to the selected memory cell and in which leakage of the write-in current into memory cells adjacent to the selected memory cell is prevented, thereby providing a reliable information-storing operation.

11 Claims, 9 Drawing Figures

PROGRAMMABLE READ-ONLY MEMORY DEVICE

BACKGROUND OF THE INVENTION (1) Field of the Invention

The present invention relates to a programmable read-only memory (ROM) device and more particularly to a memory device in which information is written into a selected memory cell by applying a high voltage ($PV_{ce}$), for controlling the write-in condition, to a terminal (for example, a chip-enable terminal). This enables the memory device to assume a write-in condition. By supplying a write-in current to the bit line connected to the selected memory cell, leakage of the write-in current into adjacent memory cells is prevented.

(2) Description of the Prior Art

Generally, in a programmable ROM device (hereinafter referred to as a PROM device) having junction-shorting-type memory cells or fuse-blown-type memory cells, information is written into a memory cell by applying a high voltage ($PV_{ce}$), for controlling the write-in condition, to a terminal (for example, a CE terminal) so that the memory device assumes a write-in condition by applying a write-in current to a bit line and by rendering the potential of a work line to be low, thereby destroying the PN junction of the memory cell or blowing the fuse thereof. In this case, in a PROM device having, for example, junction-shorting-type memory cells, if the junction of a memory cell adjacent to a memory cell into which information is to be written is already shorted, a write-in current sometimes leaks from a bit line through the adjacent memory cell into a word line, thereby disabling the write-in operation in a selected memory cell. This phenomenon occurs when the resistance of the semiconductor substrate on which the memory device is formed is not small enough and causes write-in error in a PROM device. Therefore, it is necessary to avoid the occurrence of such a phenomenon.

In order to prevent the leakage of a write-in current into adjacent memory cells, a conventional PROM device uses a high voltage, for controlling the write-in condition, as an output power supply voltage of each of the decoder driver circuits connected to the word lines, thereby pulling up the potential of all the non-selected word lines to a high voltage, for example, 20 V, which is higher than the potential rise of a bit line caused by applying a write-in current thereto.

However, in the above-mentioned conventional PROM device, since the collector current, and, therefore the base current, of the output transistor of each decoder driver circuit connected to each word line becomes large, it is necessary to use large-sized output transistors, with the result that it is difficult to increase the degree of integration of the PROM device. Moreover, in the above-mentioned conventional PROM device, since the base current of each of the output transistors is large, it is necessary to use, in the pre-stage, large-sized transistors, with the result that the degree of integration of the memory device is decreased and the operating speed thereof is low.

SUMMARY OF THE INVENTION

In order to eliminate the above-mentioned problems of the conventional PROM device, the present invention adopts the idea of using a pull-up circuit which pulls up the potential of the word lines, including the word lines adjacent to a selected memory cell, to a high voltage.

It is the object of the present invention to prevent the leakage of a write-in current into adjacent memory cells wtihout using large-sized decoder driver circuits and to provide a memory device having a high degree of integration and a high operating speed.

According to the present invention, this object is attained by providing a PROM device comprising memory cells connected between word lines and bit lines. The writing of information into a memory cell is effected by selecting a word line and a bit line connected to the memory cell into which information is to be written, by rendering the potential of the word line low, and by applying a write-in current to the bit line, characterized in that the memory device comprises a pull-up circuit for non-selected word lines. The pull-up operated by a word line-selecting address signal and applies a high voltage to at least non-selected word lines adjacent to a selected word line, the high voltage being equal to or higher than the voltage applied to a selected bit line when the write-in operation is effected.

DESCRIPTION OF THE PREFERRED EMBODIMENTS

Figure 1:
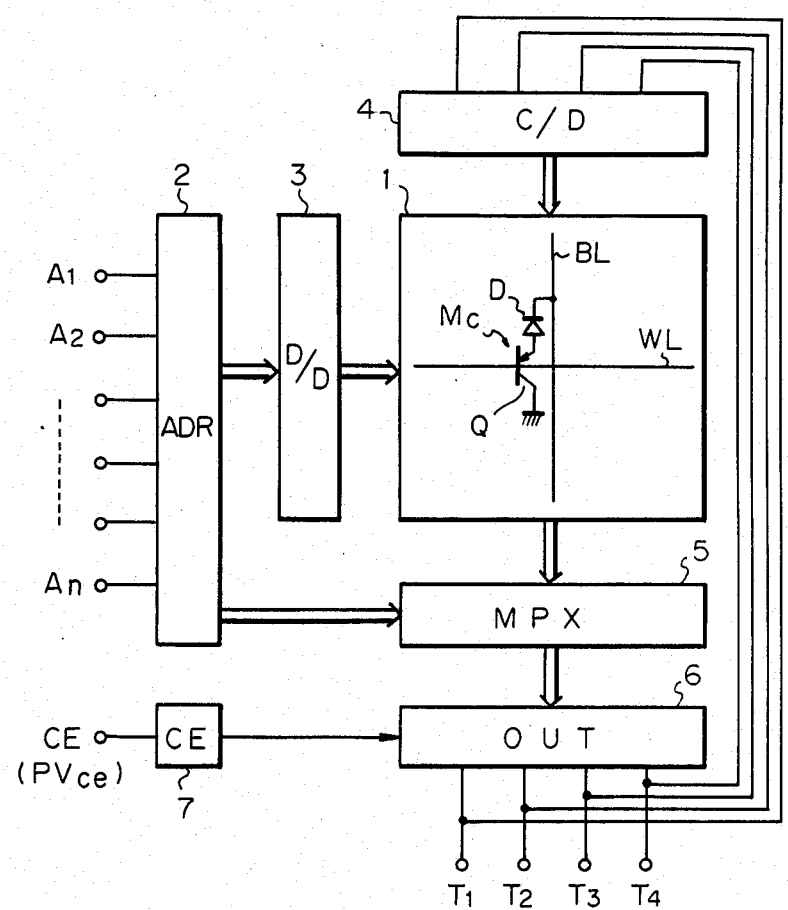
FIG. 1 is a block circuit diagram of the structure of a conventional PROM device.

The embodiments of the present invention are now described with reference to the drawings in comparison with the prior art. FIG. 1 is a conventional PROM device. In FIG. 1, 1 designates a memory matrix comprising a plurality of memory cells MC, each memory cell MC being disposed at the intersection of a word line WL and a bit line BL. Each of the memory cells MC comprises, for example, a diode D and a PNP transistor Q. The cathode of the diode D is connected to the bit line BL, and the anode thereof is connected to the emitter of the PNP transistor Q. The base of the transistor Q is connected to the word line WL, and the collector thereof is grounded. In FIG. 1, only one word line WL and only one bit line are illustrated. However, in practice, the memory device of FIG. 1 comprises a plurality of word lines, bit lines, and so on. Reference numeral 2 designates an address buffer, 3 designates a decoder driver for word addresses, 4 designates a current distributer, i.e., a program circuit, 5 designates a multiplexer, 6 designates an output circuit, and 7 designates a chip-enable buffer.

In the PROM device of FIG. 1, each piece of memory data is stored depending on whether the PN junction of the diode D of each memory cell MC is short-circuited or not. When the thus-stored data is read out of a predetermined memory cell MC, address signals A0, A1, ---, An are input into the address buffer 2 in order to select the predetermined memory cell MC. The upper bits of the address signals are used, for example, as word address signals and are applied to the decoder driver 3 through the address buffer 2. The lower bits of the address signals are used as bit address signals and are applied to the multiplexer 5 through the address buffer 2. The decoder driver 3 renders the potential of the word line corresponding to the input word address signal, i.e., the selected word line, a low level. The multiplexer 5 connects the bit line corresponding to the input bit address signal, i.e., the selected bit line, to the output circuit 6. The output circuit 6 is controlled by the chip-enable signal CE applied thereto through the chip-enable buffer 7 and is activated when the chipenable signal CE is high (the readout mode). If the PN junction of the diode D of a selected memory cell MC is destroyed, i.e., short-circuited, the potential of the bit line BL is pulled down to a low level by the diode D and the transistor Q is turned on, thereby effecting the readout of information, for example, "1". If the PN junction of the diode D of a selected memroy cell MC is not destroyed, the potential of the bit line BL becomes high and information, for example, "0", is read out. That is, when a readout operation is effected, an ordinary power supply voltage, for example, 5 V, is supplied to the bit line BL through a resistor and so on. The potential of the bit line BL becomes low if the PN junction of the diode D is short-circuited and becomes high if the PN junction is not destroyed. Therefore, such a change of the potential of the bit line is output at the output terminals T1 through T4 via the output circuit 6. As is illustrated in Fig.1, the PROM device comprises four output terminals T1 through T4. This is because each word designated by one of the address signals A0, A1, ---, An comprises four bits, and four-bit output data forming one word is output at the same time by applying one address signal to the PROM device.

In the PROM device of FIG. 1, when information is written thereinto, a write-in-condition control voltage ($PV_{ce}$) is applied to a chip-enable terminal, thereby setting the PROM device in a write-in condition. Then a word line is selected and rendered a low level by one of the address signals A0, A1, ---, An, and the output circuit 6 is disabled so that the output terminals T1 through T4 are disconnected from the output circuit 6. In this condition, a write-in current is supplied to one or more of the output terminals T1 through T4 corresponding to one or more bits into which data "1" is written. The write-in current is supplied to each of the corresponding bit lines through the program circuit 4. In this case, since the selected word line WL is at a low potential level and the transistor Q is turned on, a write-in current is supplied from the bit line B to the diode D and the PN junction of the diode D is destroyed. This results in the write-in current flowing through the bit line BL, the diode D, and the transistor Q to the output transistor of the decoder driver and to the ground. Thus, the information is written into a selected memory cell.

Figure 2:
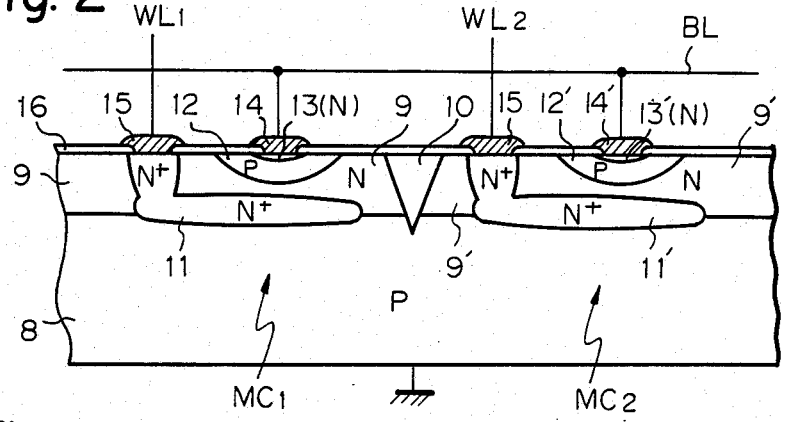
FIG. 2 is a sectional view of junction-shorting-type memory cells.

FIG. 2 is a sectional diagram of the structure of memory cells used in the PROM device of FIG. 1. FIG. 2 shows two adjacent memory cells MC1 and MC2 connected to adjacent word lines WL1 and WL2 and a common bit line BL. In FIG. 2, 8 designates a P-type semiconductor substrate, 9 designates an N-type epitaxial layer, 10 designates an isolation region, 11 designates an N+-type buried layer connected to the word line WL1 or WL2, 12 designates a P-type diffusion layer, 13 designates an N-type diffusion layer, 14 designates a conducting layer connected to the N-type diffusion layer 13, 15 designates a conducting layer connected to the N+-type buried layer 11, and 16 designates an insulation film. In the structure of FIG. 2, the P-type diffusion layer 12 and the N-type diffusion layer 13 form a diode D of a memory cell, and the P-type diffusion layer 12, the N-type epitaxial layer 9, the N+-type buried layer 11, and the P-type semiconductor substrate 8 form a vertical PNP transistor of a memory cell. Therefore, the afore-mentioned writing of information into a memory cell is effected by destroying, i.e., by short-circuiting, the PN junction between the P-type diffusion layer 12 and the N-type diffusion layer 13.

Figure 3:
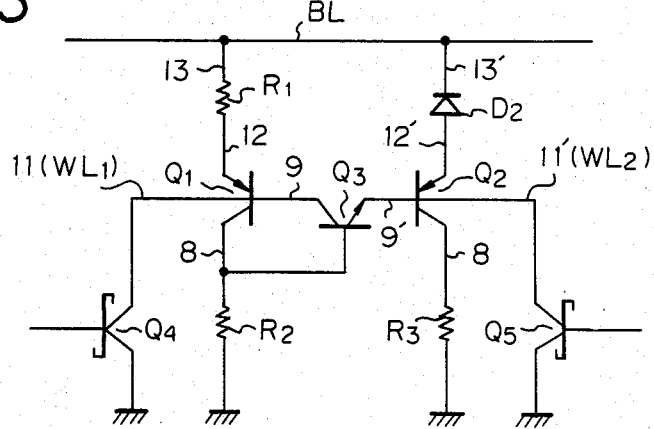
FIG. 3 is an electric circuit diagram of an equivalent circuit of the memory cells of FIG. 2.

FIG. 3 is an equivalent circuit of the memory cells of FIG. 2 in which information is written into the memory cell MC1 connected to the word line WL so that the PN junction between the P-type diffusion layer 12 and the N-type diffusion layer 13 is short-circuited. In FIG. 3, a resistor R1 represents the PN junction of the memory cell MC1 which is shoft-circuited, a transistor Q1 represents the PNP transistor of the memory cell MC1, and a resistor R2 represents the resistance component in the direction of thickness of the P-type semiconductor substrate 8. A diode D2 and a transistor Q2 represent the PN junction and the PNP transistor of the memory cell MC2, respectively, and a resistor R3 represents the resistance component in the direction of thickness of the P-type semiconductor substrate 8. A transistor Q3 represents an NPN-type transistor comprising the N-type epitaxial layer 9, the P-type semiconductor substrate 8, and an N-type epitaxial layer 9'. Transistors Q4 and Q5 are the output transistors of the decoder driver connected to the word lines WL1 and WL2, respectively.

In the circuit of FIG. 3, when information is newly written into the memory cell MC2, the transistor Q5 is turned on to lower the potential of the word line WL2, and a write-in current is supplied to the bit line BL. In this case, if the potential of the adjacent word line WL1 into which information has already been written is not high enough, i.e., if the potential of the word line WL1 is not equal to or is not higher than the potential of the bit line BL in the write-in condition, the transistor Q1 is turned on, and the potential of the collector of the transistor Q1, i.e., of the base of the transistor Q3, is pulled up so that the transistor Q3 is turned on. Therefore, the write-in current leaks from the bit line BL through the resistor R1, the transistor Q1, the transistor Q3, and the output transistor Q5 of the decoder driver which is turned on, thereby making the writing of information into the memory cell MC2 impossible.

Figure 4:
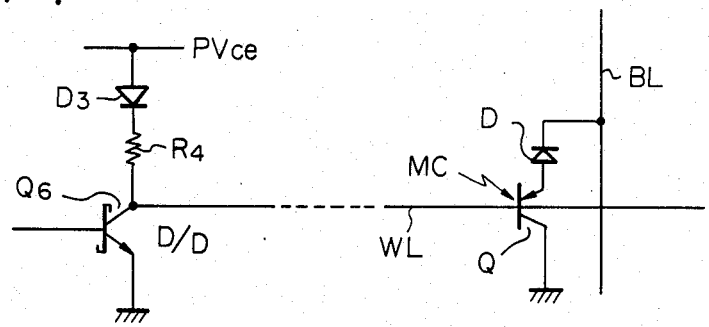
FIG. 4 is an electric circuit diagram of a conventional decoder driver circuit.

In order to prevent the above-mentioned leakage of the write-in current into the adjacent memory cell, a conventional PROM device is used in an arrangement in which the collector of the output transistor Q6 of the decoder driver for the word address is connected to a high voltage $PV_{cc}$ for controlling the write-in condition, for example, 20 V, through a resistor R4 and a diode D3 forming a load circuit, as is shown in FIG. 4. In the circuit of FIG. 4, since each output transistor Q6 of the decoder driver circuit connected to each non-selected word line is turned off, the potential of each nonselected word line is pulled up to approximately the high voltage $PV_{ce}$ for controlling the write-in condition and becomes higher than the potential of the bit line to which the write-in current is applied. Therefore, the PNP transistors of the non-selected memory cells are not turned on and the aforementioned leakage of the write-in current is prevented.

However, in the above-mentioned conventional PROM device, since an additional current, having a magnitude of approximately 15 through 20 percent of the write-in current, flows into the output transistor of the decoder driver circuit through the resistor and the diode of the collector circuit from the high voltage source $PV_{ce}$ in addition to the write-in current, it is necessary to use a large-sized output transistor. Therefore, the degree of integration is decreased. Also, since it is also necessary to use a large-sized transistor in the prestage address buffer circuit which drives the output transistor, the degree of integration of the memory device is further decreased and the operating speed thereof becomes low.

Figure 5:
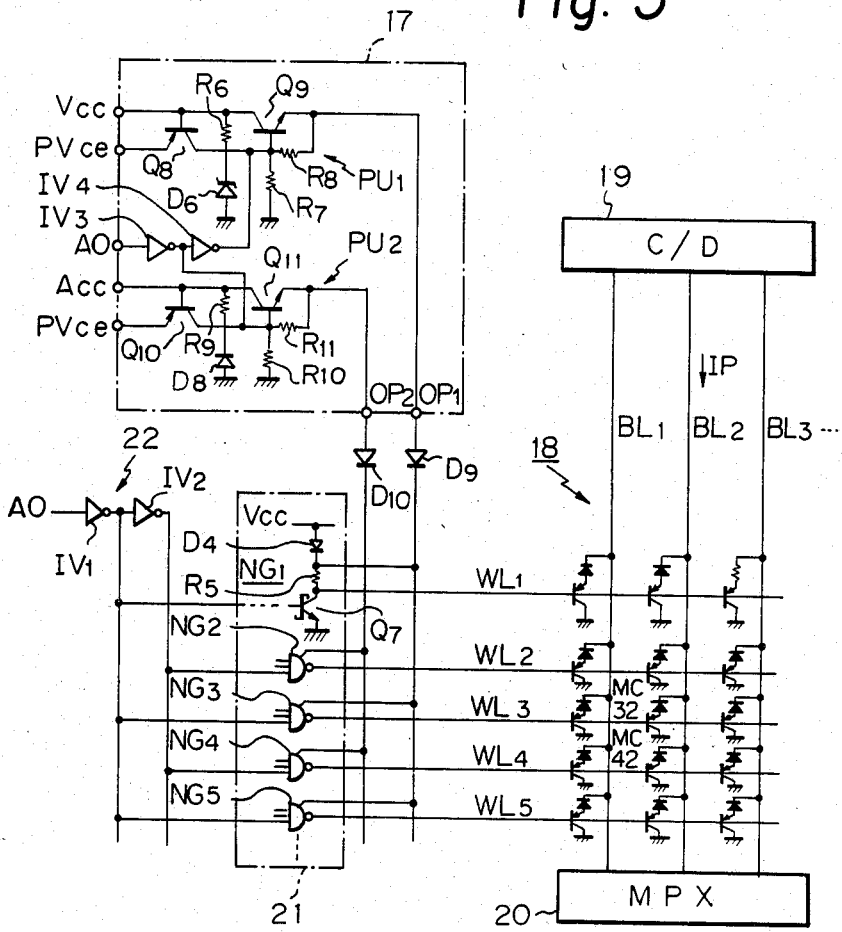
FIG. 5 is a block circuit diagram of a PROM device as an embodiment of the present invention.

FIG. 5 is a part of a circuit of the PROM device as an embodiment of the present invention. In FIG. 5, reference numeral 17 designates a pull-up circuit for word lines, 18, 19 and 20 designate a memory matrix, a program circuit and a multiplexer, respectively, and correspond to reference numerals 1, 4 and 5, respectively in FIG. 1. Reference numeral 21 designates a decoder driver for word lines, and 22 designates an address buffer corresponding to the signal A0, which is the least significant bit of the word address signal. The memory matrix 28 comprises a plurality of memory cells disposed at the intersections of a plurality of word lines WL1, WL2, WL3, WL4, --- and a plurality of bit lines BL1, BL2, BL3, ---. Each of the memory cells is composed of one diode and one PNP transistor, being similar to the memory cell used in the PROM device of FIG. 1. Among these memory cells of FIG. 5, each of the memory cells into which information has already been written and whose diodes are short-circuited is represented by a PNP transistor and a resistor instead of by a PNP transistor and a diode. The decoder driver 21 comprises NAND gates NG1, NG2, N3, --- connected to the word lines WL1, WL2, WL3, ---. The collector of the output transistor, for example, Q7, of each NAND gate is connected to the corresponding word line and to a main power source $V_{cc}$ of, for example, 7 V, of the PROM device through a load resistor R5 and a diode D4. The address buffer 22, corresponding to the address signal A0, comprises two inverters IV1 and IV2. The pull-up circuit 17 for non-selected word lines comprises a pull-up circuit PU1 for pulling up the potential of the odd numbered word lines WL1, WL3, ---, a pull-up circuit PU2 for pulling up the potential of the even numbered word lines WL2, WL4, ---, and two inverters IV3 and IV4 for inverting the address signal A0. The pull-up circuit PU1 comprises a PNP-type transistor Q8, an NPN-type transistor Q9, a zener diode D6, and resistors R6, R7 and R8. The pull-up circuit PU2 comprises a PNP-type transistor Q10, an NPN-type transistor Q11, a zener diode D8, and resistors R9, R10 and R11. The output terminal of the pull-up circuit PU1, i.e., the emitter of the transistor Q9, is connected, through a diode D9, the connecting points of the resistors and the diodes in the load circuits of the output transistors, such as Q7, of the decoder driver circuit 21 connected to the odd numbered word lines WL1, WL3, ---. In a similar manner, the output terminal of the pull-up circuit PU2, i.e., the emitter of the NPN-type transistor Q11, is connected, through a diode D10, to the connecting points of the diodes and the resistors in the load circuits of the output transistors of the decoder driver circuit connected to the even numbered word lines WL2, WL4, ---.

In FIG. 5, when data is written into a memory cell, for example, MC42, connected to the word line WL4 and the bit line BL2, the signal A0, which is the least significant bit of the word address signal, is rendered a high level and the signals of the other bits are rendered to predetermined levels so that the output transistor of the NAND gate NG4 in the decoder driver 21 is turned on and the potential of the word line WL4 becomes low. In this condition, a high voltage for the writing in of information is applied to the bit line BL2 from the program circuit 19, and a program current IP flows thereinto so that the diode of the memory cell MC42 is short-circuited and the writing in of information is effected. The program current IP flows form the short-circuited diode into the word line WL4 through the emitter-base junction of the PNP-type transistor and flows into the ground through the output transistor of the NAND gate NG4 in the decoder driver circuit 21. In this case, all of the odd numbered word lines including the word lines WL3 and WL5 are adjacent to the word line WL4 are pulled up to a high voltage, which is near the high voltage $PV_{ce}$ for controlling the write-in condition, due to the operation of the pull-up circuit 17 for non-selected word lines. Therefore, the program current IP does not leak through the adjacent memory cell MC32 and other memory cells and the write-in operation is definitely and appropriately performed.

In the pull-up circuit 17, when the address signal A0 becomes high, the output of the inverter IV3 becomes low and the output of the inverter IV4 becomes high. In this condition, the high voltage $PV_{ce}$ for controlling the write-in condition is applied to the pull-up circuit 17, thereby turning on the transistor Q8. Moreover, the output of the inverter IV4 becomes high so that the transistor Q9 is turned on. In the pull-up circuit PU2, since the base voltage $V_{cc}$ of the transistor Q10 is lower than the emitter voltage $PV_{ce}$ thereof, the transistor Q10 is turned on. However, since the output voltage of the inverter IV3 is low, the transistor Q11 is turned off. Therefore, the potential of the output terminal OP1 of the pull-up circuit PU1 becomes approximately equal to the high voltage $PV_{ce}$ for controlling the write-in condition and is higher than the potential of the bit line, the potential of the bit line being pulled up by the write-in current. This potential is applied to the word lines WL1, WL3, WL5, --- through the load resistors of the output transistors of the NAND gates of the decoder driver circuits connected to the odd numbered word lines and through the diode D9. In this condition, the diode D4, connected between the load resistors, and the main power source $V_{cc}$ are in a cut-off state. Since the transistor Q11 of the pull-up circuit PU2 is in a turned-off state, the output terminal OP2 is in a floating state. Therefore, the main power source $V_{cc}$ is applied to a non-selected word line, for example, WL2, among the even numbered word lines WL2, WL4, ---. In this condition, the potential of the selected word line WL4 is low, as was mentioned above. Therefore, the potential of the word lines WL3 and WL5 adjacent to the selected word line WL4 becomes higher than the potential of the bit lines; the potential of the bit lines being pulled up by the application of a write-in current, with the result that leakage of the program current IP into the adjacent memory cells is prevented.

Figure 6:
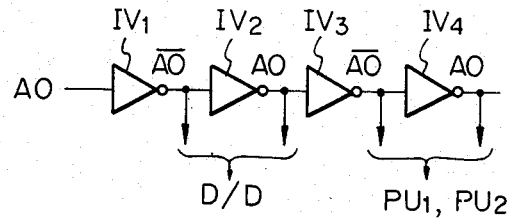
FIG. 6 is a block circuit diagram of inverter circuits used in a PROM device as another embodiment of the present invention.

In the circuit of FIG. 5, it is possible to use common inverters instead of the inverters IV1, IV2, IV3 and IV4, which invert the address signal A0. However, in this case, since a current flows into the inverter IV3 of the pull-up circuit 17 for the non-selected word lines from the transistor Q10, it is necessary to use large-sized output elements in the inverters, with the result that the operating speed in a readout mode and so on may be slow. Therefore, it is preferable to use separate inverters in parallel as the inverters IV1 and IV2 of the address buffer 22 and the inverters IV3 and IV4 of the pull-up circuit 17, as is illustrated in FIG. 5. As is illustrated in FIG. 6, it is also possible to connect the inverters IV1 through IV4 in cascade fashion, two pre-stage inverters IV1 and IV2 being connected to the decoder driver for the address buffer and two post-stage inverters IV3 and IV4 being connected to the pull-up circuit 17. In this case, since the output elements of the inverters IV1 and IV2 for the address buffer can be small, it is possible to increase the degree of integration and the operating speed of the memory device.

Figure 7:
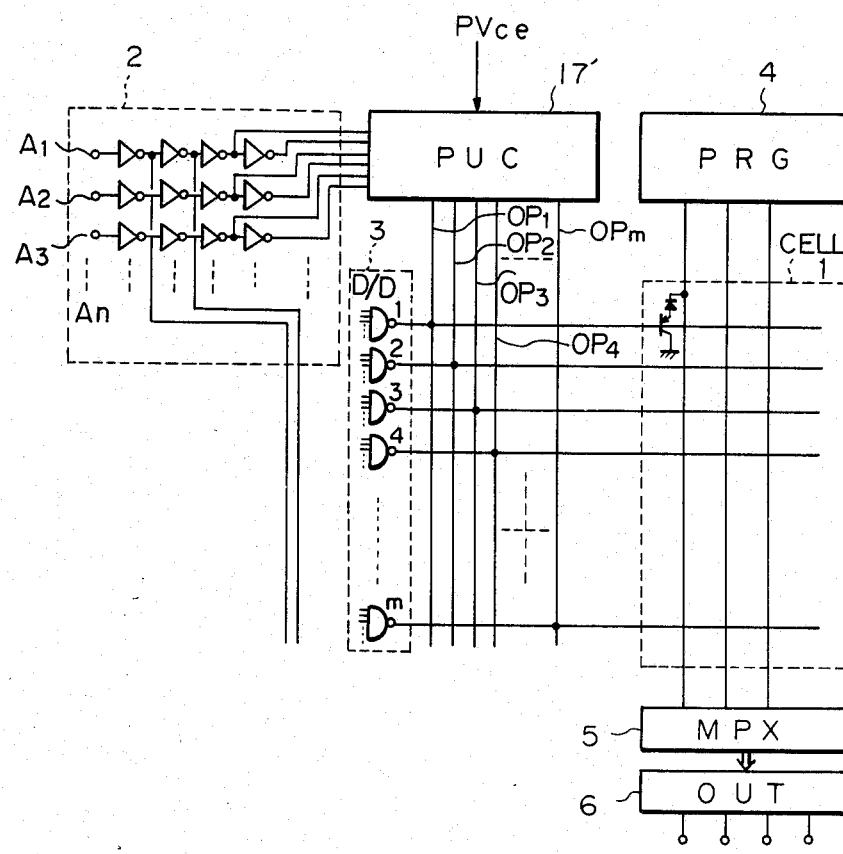
FIG. 7 is a block circuit diagram of a PROM device as another embodiment of the present invention.

FIG. 7 is a circuit of another embodiment of the present invention. The circuit of FIG. 7 essentially differs from that of the first embodiment in that the operation of a pull-up circuit 17' for non-selected word lines is controlled by a plurality of address signals. For this purpose, the address buffer 2 comprises a plurality of cascade-connected inverter circuits, each being shown in FIG. 6, for every address input, thereby applying non-inverted and inverted signals of every address signal to the pull-up circuit 17'. The pull-up circuit 17' receives these address signals and applies a high voltage to nonselected word lines through output terminals OP1 through OPm. If the pull-up circuit 17' is operated by using all of the bits of the address signals A0 through An, the pull-up circuit 17' necessitates $m = 2^n$ output terminals OP1 thorugh OPm and a decoding function so that a high voltage for pulling up the potential of word lines is output from all of the output terminals except one output terminal connected to a selected word line. For this purpose, the pull-up circuit 17' has a structure in which the inverters IV3 and IV4 in the pull-up circuit 17 shown in FIG. 5 are replaced by NAND gates used, for example, in the decoder driver 3. In such a structure, since the potential of all of the non-selected word lines is pulled up to a high voltage, it is not necessary to consider the arrangement of the word lines used in the embodiment of FIG. 5. In the embodiment of FIG. 7, the circuit structure of the pull-up circuit 17' for non-selected word lines is more complex than that of the pull-up circuit 17 of the embodiment of FIG. 5, and, therefore, the degree of integration of the circuit of FIG. 7 is reduced compared with that of FIG. 5 due to the presence of the complex pull-up circuit 17'. However, the operating speed thereof is increased. That is, the size of the output transistors of the decoder driver circuit can be reduced to a minimum size sufficient for supplying the write-in current. It is not necessary for the output transistors to supply a high voltage to non-selected word lines such as those of the conventional memory device. This has the result that the size of the output transistors can be relatively small. Therefore, it is not necessary to drive larger-than-necessary transistors in a readout operation, with the result that the operating speed is faster than that of the conventional memory device.

Figure 8:
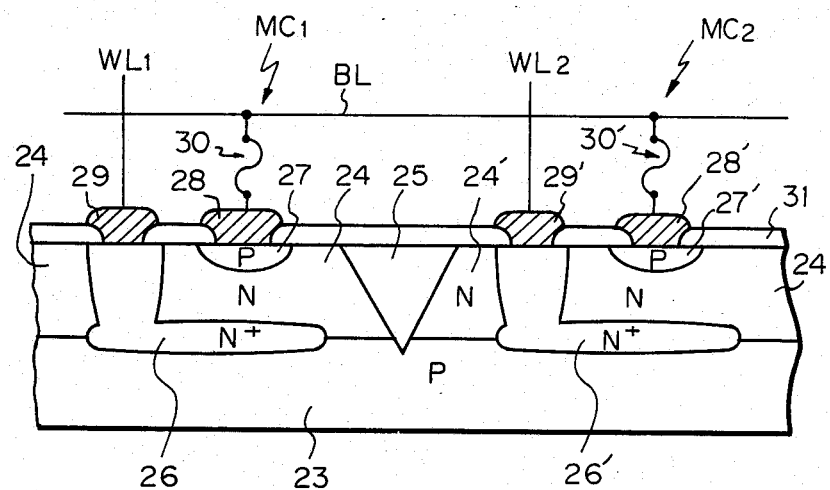
FIG. 8 is a sectional view of fuse-blown-type memory cells.

Although the above description is concerned with shorted-junction-type memory cells, the present invention is not limited to a memory device which uses shorted-junction-type memory cells. It is adaptable to a memory device using, for example, fuse-blown-type memory cells. FIG. 8 is a fuse-blown-type memory cell. In FIG. 8, reference numeral 23 designates a P-type semiconductor substrate, 24 and 24' designate regions of an N-type epitaxial layer, 25 designates an isolation region, 26 and 26' designate N+-type buried layers, 27 and 27' designate P-type diffusion layers, 28, 28', 29 and 29' designate conducting layers, 30 and 30' designate fuses, and 31 designates an isolation layer.

FIG. 8 shows the structure of two memory cells MC1 and MC2 connected to a common bit line BL and to mutually adjacent word lines WL1 and WL2. Each of the memory cells MC1 and MC2 comprise a fuse and a PNP-type transistor. When information is written into such memory cells, a high voltage for controlling the write-in condition is applied, for example, to a CE terminal, a write-in current is applied to a word line, and the word line is rendered a low potential level, thereby blowing the aforementioned fuse.

Figure 9:
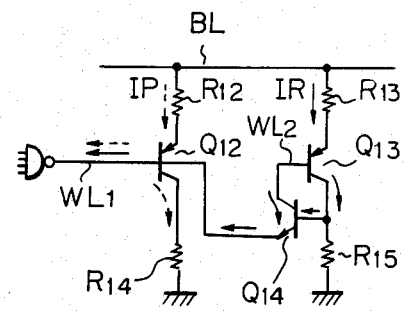
FIG. 9 is an electric circuit diagram of an equivalent circuit of the memory cells of FIG. 8.

FIG. 9 is an equivalent circuit of the memory cells of FIG. 8. In FIG. 9, a transistor Q12 is comprises the P-type diffusion layer 27, the N-type epitaxial layer 24, the N+-type buried layer 26, and the P-type semiconductor substrate 23. A PNP-type transistor Q13 comprises the P-type diffusion layer 27', the N-type epitaxial layer 24', the N+-type buried layer 26', and the P-type semiconductor substrate 23. Resistors R12 and R13 respresent the fuses 30 and 30', respectively, and resistors R14 and R15 represent the resistance component of the P-type semiconductor substrate 23 in the direction of the depth thereof. An NPN transistor Q14 comprises the N-type epitaxial layers 24 and 24' and the P-type semiconductor substrate 23.

As is shown in the circuit of FIG. 9, in a memory device using fuse-blown-type memory cells, a program current leaks when information is written into a memory cell, for example, MC1, if information has not yet been written into an adjacent memory cell, for example, MC2. That is, in such a condition, a write-in current is applied to the bit line BL, and the word line WL1 is pulled down to a low potential level. If the word line WL2 is not pulled up, by a high voltage for controlling the write-in condition, to a potential which is equal to or higher than the potential of the bit lines pulled up by the application of the write-in current, the transistor Q13 and, therefore, the transistor Q14 are turned on, and a leakage current IR flows from the bit line BL in the direction of the arrows of solid lines in FIG. 9. Therefore, it is also necessary to pull up the potential of the word lines adjacent to the selected word line to a potential approximately equal to a high voltage for controlling the write-in condition in a memory device using fuse-blown-type memory cells. It is possible, in a memory device using fuse-blown-type memory cells, to effectively prevent leakage of the program current by using the pull-up circuit for non-selected word lines according to the present invention.

According to the present invention, in a PROM device in which data is written thereinto by applying to a terminal (for example, a chip-enable terminal) a high voltage ($PV_{cc}$) for controlling the write-in condition to change the PROM device to a write-in condition, by applying a write-in current to a bit line, and by rendering the potential of a word line low, it is possible to effectively pull up the potential of the word lines adjacent to the selected word line to a level which is higher than the potential of the bit line to which the write-in current is applied by using a high voltage for controlling the write-in condition. Since the PROM device according to the present invention does not use a high voltage for controlling the write-in condition as a power supply voltage for the output circuit of the decoder driver but instead uses a normal main-power-supply voltage which is low, the sink current of the output transistor of the decoder driver is approximately equal to the write-in current and, therefore, the size of the output transistors of the decoder driver is small, thereby increasing the degree of integration of the memory device. Moreover, according to the present invention, it is possible to decrease the size of the output elements of the inverters forming the address buffers, and, thus, the degree of integration of the memory device can be further increased and the operating speed of the memory device can be made fast.

What is claimed is:

1. A programmable read-only memory device operatively connected to receive a word line selecting address signal, comprising:
   word lines;
   bit lines intersecting said word lines;
   memory cells operatively connected at the intersections of said word lines and said bit lines, the writing of information into one of said memory cells being effected by selecting corresponding ones of said word lines and bit lines connected to said one of said memory cells into which information is to be written by rendering the potential of said corresponding one of said word lines low, and by applying a write-in current to said corresponding one of said bit lines; and
   a pull-up circuit, operatively connected to said word lines and operatively connected to receive the word line selecting address signal, for pulling up the potential of nonselected word lines, and applying a high voltage to every other one of said non-selected word lines, said high voltage being equal to or higher than the voltage applied to a selected bit line when a write-in operation is effected.

2. A programmable read-only memory device according to claim 1, wherein said pull-up circuit for non-selected word lines is activated only by a signal generated by one bit of the word line-selecting address signal.

3. A programmable read-only memory device according to claim 2, wherein the signal generated by one bit of the word line selecting address is the least significant bit of said word line-selecting address signal.

4. A programmable read-only memory device according to claim 1, wherein the high voltage supplied by said pull-up circuit for said non-selected word lines is applied to all of said non-selected word lines.

5. A programmable read-only memory device according to claim 1, wherein said pull-up circuit for said non-selected word lines comprises:
   address inverters, operatively connected to receive the word line selecting address signal, for providing output signals; and
   a switching circuit, operatively connected to said address inverters, controlled by the output signals from said address inverters.

6. A programmable read-only memory device according to claim 5, further comprising word line address inverters operatively connected to said word lines, wherein said address inverters receive the word line address signal through said word line address inverters for word line selection.

7. A programmable read-only memory device according to claim 1, wherein each of said memory cells is a junction-shorting-type memory cell.

8. A programmable read-only memory device according to claim 1, wherein each of said memory cells is a fuse-blown-type memory cell.

9. A programmable read-only memory device, operatively connected to receive a word line selecting address signal including word lines, bit lines intersecting the word lines, and memory cells operatively connected at the intersections of word lines and bit lines, comprising:
   a pull-up circuit, operatively connected to the word lines, for pulling up the potential of non-selected word lines to a high voltage level higher than the voltage level of selected word lines, comprising:
   a first pull-up unit for pulling up the potentials of odd numbered non-selected word lines; and
   a second pull-up unit, operatively connected to said first pull-up unit, for pulling up the potentials of even numbered non-selected word lines.

10. A programmable read-only memory device operatively connected to receive a word line selecting address signal, comprising:
    word lines;
    bit lines intersecting said word lines;
    memory cells operatively connected at the intersections of said word lines and said bit lines, the writing of information into one of said memory cells being effected by selecting corresponding ones of said word lines and bit lines connected to said one of said memory cells into which information is to be written by rendering the potential of said corresponding one of said word lines low, and by applying a write-in current to said corresponding one of said bit lines; and
    a pull-up circuit, operatively connected to said word lines and operatively connected to receive the word line selecting address signal, for pulling up the potential of non-selected word lines and applying a high voltage to said non-selected word lines, said high voltage being equal to or higher than the voltage applied to a selected bit line when a write-in operation is effected, said pull-up circuit for non-selected word lines being activated only by a signal generated by one bit of the word line selecting address signal and said word lines are disposed so that the high voltage supplied by said pull-up circuit for non-selected word lines is applied to every other word line.

11. A programmable read-only memory device according to claim 10, wherein the signal generated by one bit of the word line selecting address is the least significant bit of said word line selecting address signal.

* * * * *